United States Patent [19]

Schroth et al.

[11] Patent Number: 4,879,529
[45] Date of Patent: Nov. 7, 1989

[54] PHASE CONTROL LOOP WITH INTERRUPTED CONTROL

[75] Inventors: Volkmar Schroth, Nürnberg; Horst Levin, Lauf, both of Fed. Rep. of Germany

[73] Assignee: U.S. Philips Corporation, New York, N.Y.

[21] Appl. No.: 253,785

[22] Filed: Oct. 5, 1988

[30] Foreign Application Priority Data

Oct. 17, 1987 [DE] Fed. Rep. of Germany ....... 3735188

[51] Int. Cl.⁴ .......................... H03L 7/14; H03L 1/02
[52] U.S. Cl. .......................................... 331/14; 331/8; 331/25; 331/176
[58] Field of Search ...................... 331/1 R, 1 A, 8, 14, 331/15, 17, 18, 25, 34, 176; 375/81, 97, 120; 455/208, 265

[56] References Cited

U.S. PATENT DOCUMENTS 4,503,562 3/1985 McClellan, III et al. .......... 331/2 X

Primary Examiner—David Mis
Attorney, Agent, or Firm—David R. Treacy

[57] ABSTRACT

A voltage-controlled oscillator and a control substitution circuit that interrupts the control loop in case a source of normal control voltage such as a referenced frequency fails, and allows the voltage-controlled oscillator to continue to operate with a nominal control voltage. To allow the oscillator of such a loop to continue to operate for weeks with a practically unchanged frequency under certain circumstances, after the normal control voltage source has failed, the nominal control voltage can be selected such that the oscillator produces an oscillation of a preset frequency. Simultaneously with change-over of the oscillator to the preset frequency, its voltage-to-frequency characteristic is changed by the control substitution circuit such that a change of the control voltage leads to a smaller change in the frequency than in normal operating conditions. To compensate the temperature dependency of the output frequency of the oscillator, the nominal control voltage that is applied to the oscillator input during control substitution is made temperature-dependent.

12 Claims, 2 Drawing Sheets

PHASE CONTROL LOOP WITH INTERRUPTED CONTROL

BACKGROUND OF THE INVENTION

The invention relates to a phase control loop with a voltage-controlled oscillator and a control substitution (or substitute clock change-over) circuit, that interrupts the control loop in case the reference signal or command fails, and allows the voltage-controlled oscillator or VCO to proceed with a nominal unvarying control voltage. Such a phase control loop is, for example, known from the German Patent Application DE 33 24 919 A1 and DE 34 41 226 A1.

In a phase control loop as disclosed in the German Patent Application DE 33 24 919 the "substitute clock change-over" circuit comprises a clock generator having a very high frequency compared to the reference frequency (command frequency) of the control loop, a circuit for monitoring the reference frequency, an up-down counter and a switching matrix. Despite this circuit complexity it may occur in high-speed control loops that the voltage-controlled oscillator continues to operate at a frequency that considerably differs from the frequency it furnished prior to the failure of the reference frequency. To improve such a control loop, the "substitute clock change-over" circuit according to DE 34 41 226 is extended by a computer, an integrator and a threshold detector.

It is clear from the above description that, as used herein, "substitute clock change-over" does not refer to substitution of a different clock oscillator, but rather to substitution of a different clock control circuit to allow the voltage-controlled oscillator to continue to operate after the command (reference frequency) has failed. Thus "substitute clock change-over circuit" refers to what is actually a control substitution circuit.

SUMMARY OF THE INVENTION

The invention has for its object to provide a phase control loop of the type mentioned in the opening paragraph, whose substitute clock change-over, or control substitution circuit is less costly, and whose voltage-controlled oscillator, after the reference frequency has exhibited a failure, can under certain conditions still continue to operate at a practically unchanged frequency.

This object is achieved with a phase control loop of the type mentioned in the opening paragraph when the loop is controlled by the normal control voltage, a voltage is provided at which the oscillator produces an oscillation of a preset frequency, and when the normal control is interrupted the "substitute clock" or control change-over circuit changes the characteristic line (slope or change of frequency versus voltage) of the voltage-controlled oscillator to such an extent that a change of the control voltage leads to a smaller change in the frequency than in normal operating conditions.

The invention will be further explained with reference to an embodiment represented in the drawing.

DESCRIPTION OF THE PREFERRED EMBODIMENTS

Figure 1:
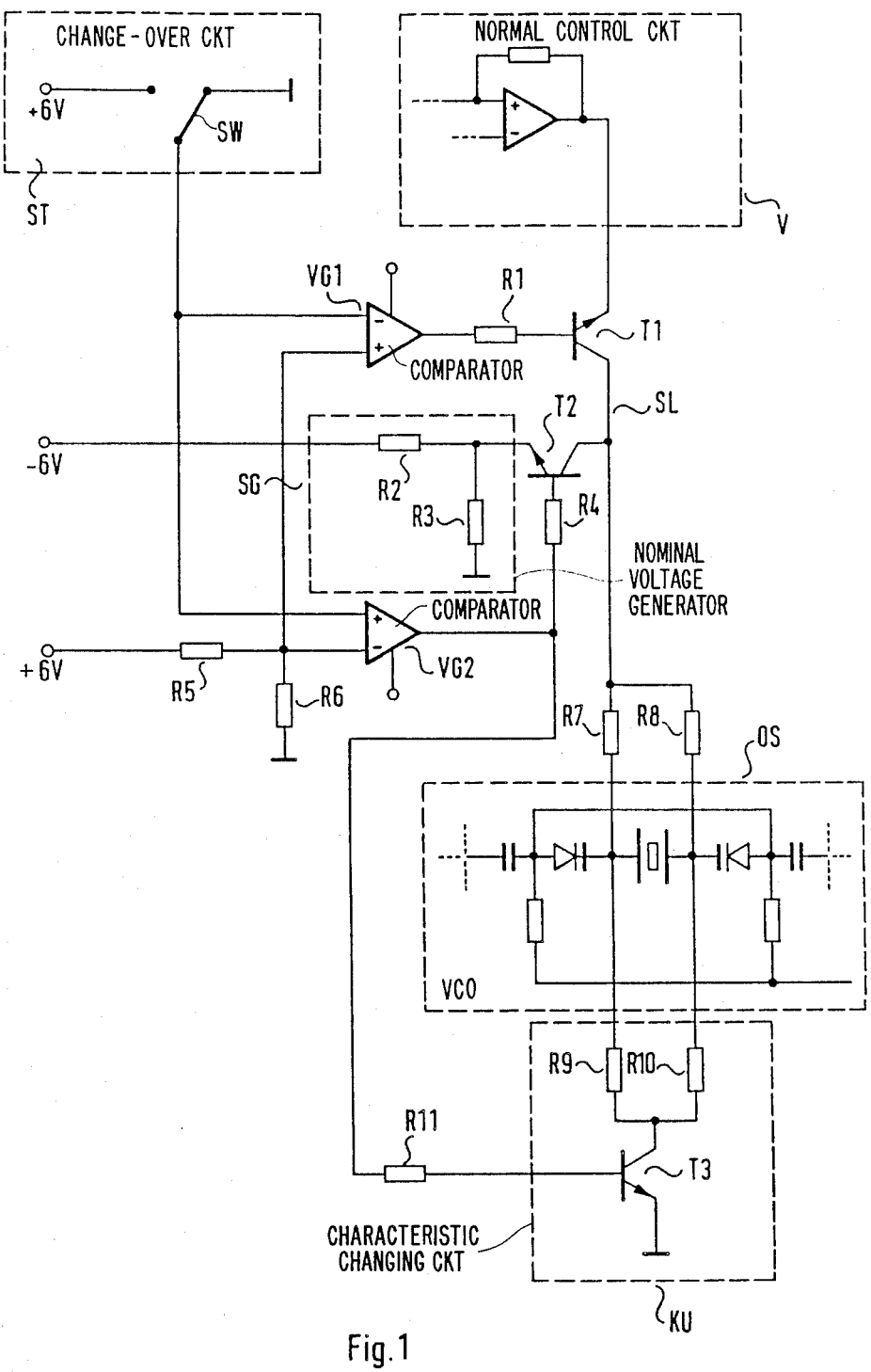
FIG. 1 shows a section of a phase control loop with the essential components of a control substitute in circuit according to the invention.

In FIG. 1 are shown only the components of a phase control loop that are essential to the explanation of the invention. These components are an amplifier V, amplifying a normal control voltage of the control loop, and a subsequent voltage-controlled oscillator OS. Details of the amplifier V and oscillator OS are conventional and are not shown. A change over unit ST is likewise shown without reference to detailed structure. The unit comprises a controllable change-over switch, SW and a monitoring circuit (not shown) that controls the change-over switch SW depending on the signal levels of the phase control loop. The unit ST including the controllable change-over switch ST and the monitoring circuit are components of the control substitution or "substitute clock change-over" circuit whose details are not important to the invention.

A control input line SL for the oscillator OS receives the normal control signal through a controllable switch T1 which is formed by an npn transistor T1 in this embodiment. The control input line SL is connected to a reference potential switch of the control substitution circuit.

The junction between the collector of transistor T1 and the oscillator OS (that is, the input line SL) is connected through a second controllable switch (also realised by an npn transistor "T2) to an output of a nominal voltage generator SG, whose one input carries a $-6$ V voltage as a source for a point of reference potential. In its most simple embodiment the nominal voltage generator SG is an ohmic voltage divider R2, R3, whose central tap is connected to the emitter of the transistor T2.

The bases of the two transistors T1 and T2 are each driven by comparators VG1 and VG2 through the respective base resistors R1, R4. The two comparators VG1 and VG2 are identical with regard to their structure. Their inputs are connected to the central tap of a voltae divider R5, R6 and the output of the change over unit ST, such that they are always driven with oppositely equal input voltage; therefore, they can only assume opposite switch positions.

The input voltage of the voltage divider R5, R6 is $+6$ V. So, the transistor T1 is conductive when the transistor T2 blocks and vice versa.

If the phase control loop is in normal operation, the reference potential—i.e., zero Volt—is applied to the inverting input of the comparator VG1 and to the non-inverting input of the comparator VG2 through the controllable change-over switch of the unit ST; the transistor T1 then conducts and the transistor T2 blocked. If the normal reference frequency is lost, a $+6$ V voltage instead of the reference potential is applied to the same inputs of the comparators VG1 and VG2 via the controllable change-over switch. Then the transistor T1 is blocked whereas the transistor T2 conducts.

When transistor T2 is switched, the output voltage of the nominal voltage generator SG is applied to the input of oscillator OS. By selecting the resistors R2 and R3, this voltage can be selected such that the oscillator OS oscillates at a predetermined frequency. In order to have the VCO frequency change the least possible amount in the course of time during which the control substitution circuit is active, simultaneously with the switching of the transistor T2 the sensitivity of the voltage-controlled oscillator OS, is reduced owing to the fact that two voltage controllers R7, R9 and R8, R10 at the oscillator input are activated. The activation of resistors R9 and R10 is effected by means of an npn transistor T3, which is connected to the input of the comparator VG2 through a resistor R11. Because of the specific construction of the voltage-controlled oscillator OS two voltage dividers have been provided at its input.

Usually, a voltage-controlled oscillator has an input resistor anyhow, which can be used as a series resistor of the voltage divider for reducing the sensivitiy, so that the whole characteristic changing circuit KU (sensitivity reducer) consists of only one or two shunt resistors, which flatten the voltage-frequency line of the oscillator OS when the transistor T3 is switched on.

As the substitute change-over, or control substitution circuit has to remain in the switched-on mode for several weeks under specific circumstances, it is advantageous to let the temperature-dependence of the output frequency of the voltage-controlled oscillator OS be compensated by a specific arrangement of the nominal voltage generator SG.

Figure 2:
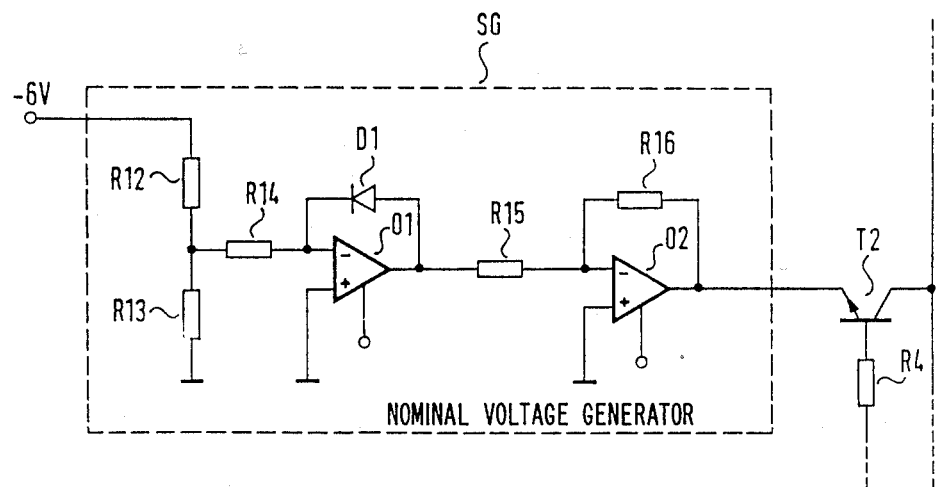
FIG. 2 shows a nominal voltage generator.

This preferred embodiment is shown in FIG. 2. The middle tap of a voltage divider R12, R13, which has the same function as the voltage divider R2, R3 in FIG. 1, is connected to the inverting input of an operational amplifier O1 through a resistor R14. The operational amplifier O1 output is fed back through a diode D1. The op amp output is also connected through a resistor R15 to the inverting input of a further operational amplifier O2 having feedback through a resistor R16. The non-inverting inputs of the operational amplifiers are connected to the reference potential. The output of the operational amplifier O2 is connected to the emitter of the transistor T2.

The temperature dependence of the parameters of the diode D1 provides a temperature-correction input voltage of the voltage-controlled oscillator OS when the nominal voltage generator is substituted. This temperature dependence equalizes the temperature variations of the output frequency of the voltage-controlled oscillator OS.

What is claimed is:

1. A phase control loop comprising a voltage-controlled oscillator, a source of normal control voltage connected to control the voltage-controlled oscillator, and a control substitution circuit that interrupts control by said source and allows the voltage-controlled oscillator to operate with a nominal control voltage,
   characterized in that said control substitution circuit comprises means for reducing the sensitivity of said voltage-controlled oscillator to changes in a control voltage applied to the oscillator while control by said source is interrupted.

2. A phase control loop as claimed in claim 1, characterized in that the control substitution circuit comprises a first controllable switch (T1) in the control input line (SL) of the voltage-controlled oscillator (OS), for interrupting the control input line (SL), and in the simultaneously via a second controllable switch (T2) the output of a nominal voltage generator (SG) supplied by a DC voltage source is connected to the control input of the voltage-controlled oscillator (OS).

3. A phase control loop as claimed in claim 2, characterized in that said nominal voltage generator comprises a first voltage divider having ohmic resistors for providing said nominal control voltage.

4. A phase control loop as claimed in claim 3, characterized in that for activating the two controllable switches one comparator each (VG1, VG2) is provided, whose output is connected through a respective resistor (R1, R4) to the control input of the associated switch (T1, T2), in that the outputs of the comparators (VG1, VG2) are switched such that they can assume only opposite switch positions nd in that the positions of a controllable change-over switch (ST) determines which one of their two switch positions the comparators (VG1, VG2) assume.

5. A phase control loop as claimed in claim 4, characterized in that one of the comparators (VG2) is connected to the control input of a third controllable switch (T3) through a resistor (R11), so that when the control input line (SL) is interrupted, a second voltage divider (R7, R9) located at the control input of the voltage-controlled oscillator (OS) is activated.

6. A phase control loop as claimed in claim 5, characterized in that between the middle tap of the first voltage divider (R12, R13) and the second controllable switch (T2) a network of feedback operational amplifiers (O1, O2) is located, of which at least one comprises a temperature-dependent resistor (D1) in the feedback branch to compensate the temperature-dependence of the voltage-to-frequency characteristic of the voltage-controlled oscillator (OS).

7. A phase control loop as claimed in claim 4, characterized in that between the middle tap of the first voltage divider (R12, R13) and the second controllable switch (T2) a network or feedback operational amplifiers (O1, O2) is located, of which at least one comprises a temperature-dependent resistor (D1) in the feedback branch to compensate the temperature-dependence of the voltage-to-frequency characteristic of the voltage-controlled oscillator (OS).

8. A phase control loop as claimed in claim 3, characterized in that between the middle tap of the first voltage divider (R12, R13) and the second controllable switch (T2) a network of feedback operational amplifiers (O1, O2) is located, of which at least one comprises a temperature-dependent resistor (D1) in the feedback branch to compensate the temperature-dependence of the voltage-to-frequency characteristic of the voltage-controlled oscillator (OS).

9. A phase control loop as claimed in claim 2, characterized in that for activating the two controllable switches one comparator each (VG1, VG2) is provided, whose output is connected through a respective resistor (R1, R4) to the control input of the associated switch (T1, T2), in that the outputs of the comparators (VG1, VG2) are switched such that they can assume only opposite switch positions and in that the position of a controllable change-over switch (ST) determines which one of their two switch positions the comparators (VG1, VG2) assume.

10. A phase control loop as claimed in claim 9, characterized in that one of the comparators (VG2) is connected to the control input of a third controllable switch (T3) through a resistor (R11), so that when the control input line (SL) is interrupted, a second voltage divider (R7, R9) located at the control input of the voltage-controlled oscillator (OS) is activated.

11. A phase control loop as claimed in claim 10, characterized in that between the middle tap of the first voltage divider (R12, R13) and the second controllable switch (T2) a network of feedback operational amplifiers (O1, O2) is located, of which at least one comprises a temperature-dependent resistor (D1) in the feedback branch to compensate the temperature-dependence of the voltage-to-frequency characteristic of the voltage-controlled oscillator (OS).

12. A phase control loop as claimed in claim 9, characterized in that between the middle tap of the first voltage divider (R12, R13) and the second controllable switch (T2) a network of feedback operational amplifiers (O1, O2) is located, of which at least one comprises a temperature-dependent resistor (D1) in the feedback branch to compensate the temperature-dependence of the voltage-to-frequency characteristic of the voltage-controlled oscillator (OS).

* * * * *